United States Patent
Fujikawa et al.

(10) Patent No.: US 6,790,774 B2
(45) Date of Patent: *Sep. 14, 2004

(54) METHOD OF FORMING A WIRING FILM BY APPLYING HIGH TEMPERATURE/HIGH PRESSURE

(75) Inventors: Takao Fujikawa, Hyogo (JP); Makoto Kadoguchi, Hyogo (JP); Kohei Suzuki, Hyogo (JP); Takuya Masui, Hyogo (JP)

(73) Assignee: Kobe Steel, Ltd., Kobe (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 10/314,990

(22) Filed: Dec. 10, 2002

(65) Prior Publication Data

US 2003/0129832 A1 Jul. 10, 2003

Related U.S. Application Data

(63) Continuation of application No. 09/553,465, filed on Apr. 19, 2000, now abandoned.

(30) Foreign Application Priority Data

Apr. 19, 1999 (JP) ............................................ 11-111129
Jun. 29, 1999 (JP) ............................................ 11-183875

(51) Int. Cl.⁷ ............................................... H01L 21/44

(52) U.S. Cl. ...................... 438/660; 438/687; 438/688; 438/672; 438/675

(58) Field of Search .......................... 438/660, 687–688, 438/672, 675, 632, 646

(56) References Cited

U.S. PATENT DOCUMENTS

| | | | |
|---|---|---|---|
| 5,610,103 A | 3/1997 | Xu et al. | |
| 5,613,296 A | 3/1997 | Kurino et al. | |
| 5,932,289 A | 8/1999 | Dobson et al. | |
| 5,953,634 A * | 9/1999 | Kajita et al. | ................. 438/687 |
| 5,985,751 A * | 11/1999 | Koyama | ...................... 438/637 |
| 5,998,296 A | 12/1999 | Saran et al. | |
| 6,090,701 A * | 7/2000 | Hasunuma et al. | ......... 438/632 |
| 6,090,702 A * | 7/2000 | Okamoto | ..................... 438/637 |
| 6,124,205 A | 9/2000 | Doan | |
| 6,153,522 A | 11/2000 | Takagi et al. | |
| 6,171,957 B1 | 1/2001 | Maekawa | |
| 6,285,010 B1 | 9/2001 | Fujikawa et al. | |
| 6,299,739 B1 | 10/2001 | Fujikawa et al. | |
| 6,323,120 B1 | 11/2001 | Fujikawa et al. | |
| 6,328,560 B1 | 12/2001 | Fujikawa et al. | |
| 6,334,249 B2 * | 1/2002 | Hsu | .......................... 438/644 |
| 6,451,682 B1 | 9/2002 | Fujikawa et al. | |
| 6,491,518 B1 | 12/2002 | Fujikawa et al. | |

FOREIGN PATENT DOCUMENTS

EP          0731503 A3     10/1997

* cited by examiner

Primary Examiner—Thanh Nguyen
(74) Attorney, Agent, or Firm—Oblon, Spivak, McClelland, Maier & Neustadt, P.C.

(57) ABSTRACT

A wiring film, which can be formed into wiring for ULSI semiconductor circuits, is formed by first forming holes in an insulating film on a substrate; then depositing a metallic material of copper, copper alloy, silver or silver alloy into the holes under an atmosphere including hydrogen; and finally annealing the deposited metallic material. The metallic material can be deposited by a sputtering process in which the atmosphere includes an inert gas in addition to the hydrogen. Hydrogen doped in the metallic material during the sputtering process promotes diffusion of atoms in the metallic material. The diffusion eliminates voids in the deposited metallic material.

15 Claims, 6 Drawing Sheets

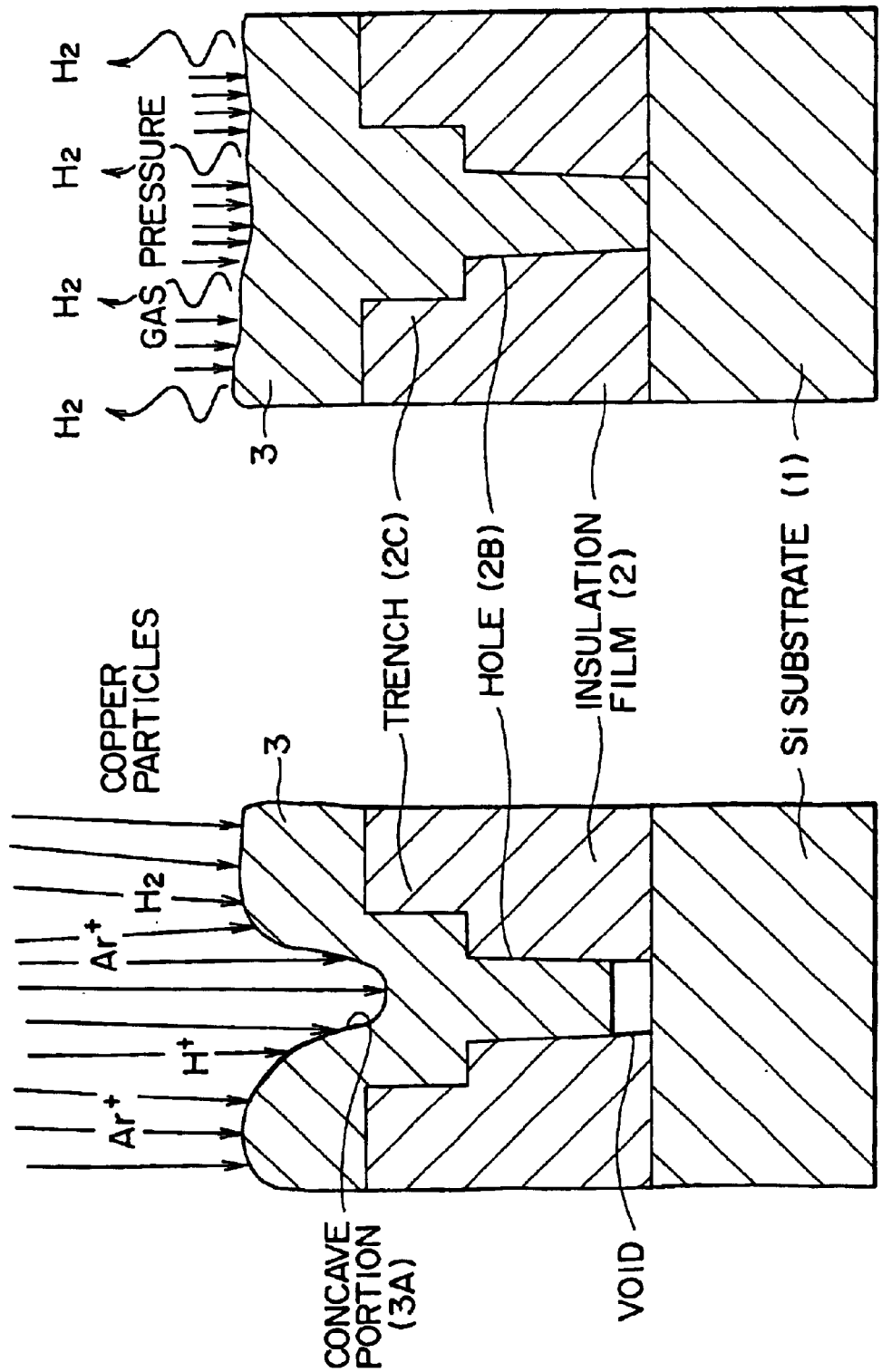

METHOD OF FORMING A WIRING FILM BY APPLYING HIGH TEMPERATURE/HIGH PRESSURE

This application is a CONTINUATION of Ser. No. 09/553,465 filed Apr. 19, 2000, now abandoned.

BACKGROUND OF THE INVENTION

1. Field of the Invention

The present invention relates to a method of forming a wiring film in a semiconductor production process. In particular, the present invention relates to a method of forming a wiring film that can be patterned into low resistance wiring for semiconductor circuits having ultra-large-scale-integration ("ULSI").

2. Description of Related Art

The degree of integration in semiconductor circuits has increased rapidly in recent years. Future increases in operational speeds appear to be limited by the dielectric constant of the $SiO_2$ used in insulation films in the circuits and by the electrical resistance of Al wiring typically used in ULSI circuits. A demand has developed for insulation films made of materials with lower dielectric constants than $SiO_2$ and for wiring with lower electrical resistance than Al.

Metals with lower electrical resistivity than aluminum, such as copper, copper alloys, silver and silver alloys, have been studied in attempts to lower the electric resistance of conventional Al wiring.

Copper materials are considered to be the most promising replacements for aluminum, because copper materials have low electrical resistance, exhibit minimal electro-migration, and are available at a reduced cost.

Because it is difficult to form wiring structures by etching copper or silver materials sputtered onto conventional insulation films, wiring structures are often formed by electro-plating material into trenches formed in insulation films. Electroplating can be used with organic insulation films. However, organic insulation films often exhibit poor heat resistance.

The electroplating method, referred to as a low temperature process, requires annealing at 300 to 400° C. to stabilize electroplated wiring before actual use. When a copper film is plated, the size of crystal grains in the film tends to increase even when the copper film is left at room temperature. Plating solution can be confined between crystal grains. As a result, voids are formed during the crystal grain growth. Although plated copper films are typically heated to about 300 to 400° C., the voids cannot be completely eliminated. Electrolytic plating methods are often adopted in order to control the rate of film formation. However, electrolytic plating requires that a seed layer be provided on the surface of a semiconductor wafer by a sputtering process or a CVD process to make the surface electrically conducting. In contrast to conventional processes for forming Al wiring, enormnous equipment installation costs are associated with plating methods. In addition, plating methods incur relatively high costs associated with disposal of plating liquid wastes.

To overcome the problem of the poor heat resistance of organic insulation films, a method has been proposed in which copper or silver films are first sputtered at low temperatures and then heat treated in hydrogen or a mixed atmosphere of hydrogen and oxygen (redox). Hole diameters in integrated circuits are expected to decrease from 0.25 $\mu$m at present to about 0.1 $\mu$m by the year 2003. Sputtering and plating methods have difficulty filling holes and trenches of these dimensions, particularly when holes have diameters of 0.15 $\mu$m or less and depths of four or more times the diameter. To fill holes and trenches at these reduced dimensions, the present inventors have proposed a method of first closing the openings of the holes or trenches with a metal film and then annealing the metal film at high temperatures in a highly pressurized gas (high pressure annealing method).

However, in the case of a copper wiring film formed by a sputtering process, a high temperature at 450 to 500° C. is necessary even when the pressure in the high pressure annealing method is increased, for example, to 200 MPa. On the other hand, as discussed above organic insulation films often lacks heat resistance. For all organic insulation films, the heat treatment temperature must be 400° C. or less, particularly, for fluorocarbons and benzocyclobutene, which have been noted as interlayer insulation films. As a result of the poor heat resistance of organic insulation films, the high pressure annealing treatment cannot be practiced with copper wiring films.

To overcome the foregoing problems in the prior art, the present inventors have made an earnest study and, as a result, have accomplished the present invention outlined as described below.

SUMMARY OF THE INVENTION

The present invention provides a method of forming a wiring film that can be patterned into wiring for semiconductor circuits.

In a first aspect of the invention, the method comprises providing holes or trenches in an insulation film on a substrate; covering the surface of the insulation film with a metallic material such as copper, copper alloy, silver or silver alloy under an atmosphere containing hydrogen; and then applying a high temperature/high pressure treatment to the metallic material to fill the metallic material, preferably completely, into the holes or trenches.

In a second aspect of the invention, the method comprises providing holes or trenches in an insulation film on a substrate; covering the surface of the insulation film with a metallic material such as copper, copper alloy, silver or silver alloy; then applying an annealing treatment to the metallic material in an atmosphere containing hydrogen and oxygen or in an atmosphere containing steam; and then applying a high temperature/high pressure treatment to the metallic material to fill the metallic material, preferably completely, into the holes or trenches.

In a third aspect of the invention, the method comprises providing holes or trenches in an insulation film on a substrate; covering the surface of the insulation film with a metallic material such as copper, copper alloy, silver or silver alloy; and then applying a high temperature/high pressure treatment to the metallic material in a mixed atmosphere containing hydrogen, a mixed atmosphere containing hydrogen, or an atmosphere containing steam to fill the metallic material, preferably completely, into the at least one hole.

The wiring film can be formed from metallic material deposited in a sputtering process in an inert gas atmosphere containing a hydrogen gas. The mixing ratio of the hydrogen gas to the inert gas can be from 1/99 to 20/80. The distance between the sputtering target and the substrate can be from 100 to 300 mm. During the sputtering, the substrate can be at a temperature from room temperature to 200° C.

The annealing treatment can be performed under an atmosphere containing one or more of hydrogen, oxygen and water (steam).

The high temperature/high pressure treatment can be conducted in an atmosphere comprising an inert gas, preferably more than 50% inert gas. The treatment can also be performed in an atmosphere containing one or more of hydrogen, oxygen and water (steam). The atmosphere can comprise a gas having an oxidative effect on the metallic material and a gas having a reducing effect on the oxide of the metallic material.

BRIEF DESCRIPTION OF THE DRAWINGS

FIG. 5A schematically shows film formation in a hole of medium aspect ratio by a sputtering process.

FIG. 5B schematically shows the film of FIG. 5A after gas pressure is applied.

DETAILED DESCRIPTION OF PREFERRED EMBODIMENTS

Preferred embodiments for the method of forming a wiring film according to the present invention and the function and concrete examples thereof will now be explained with reference to the drawings.

Figure 1:
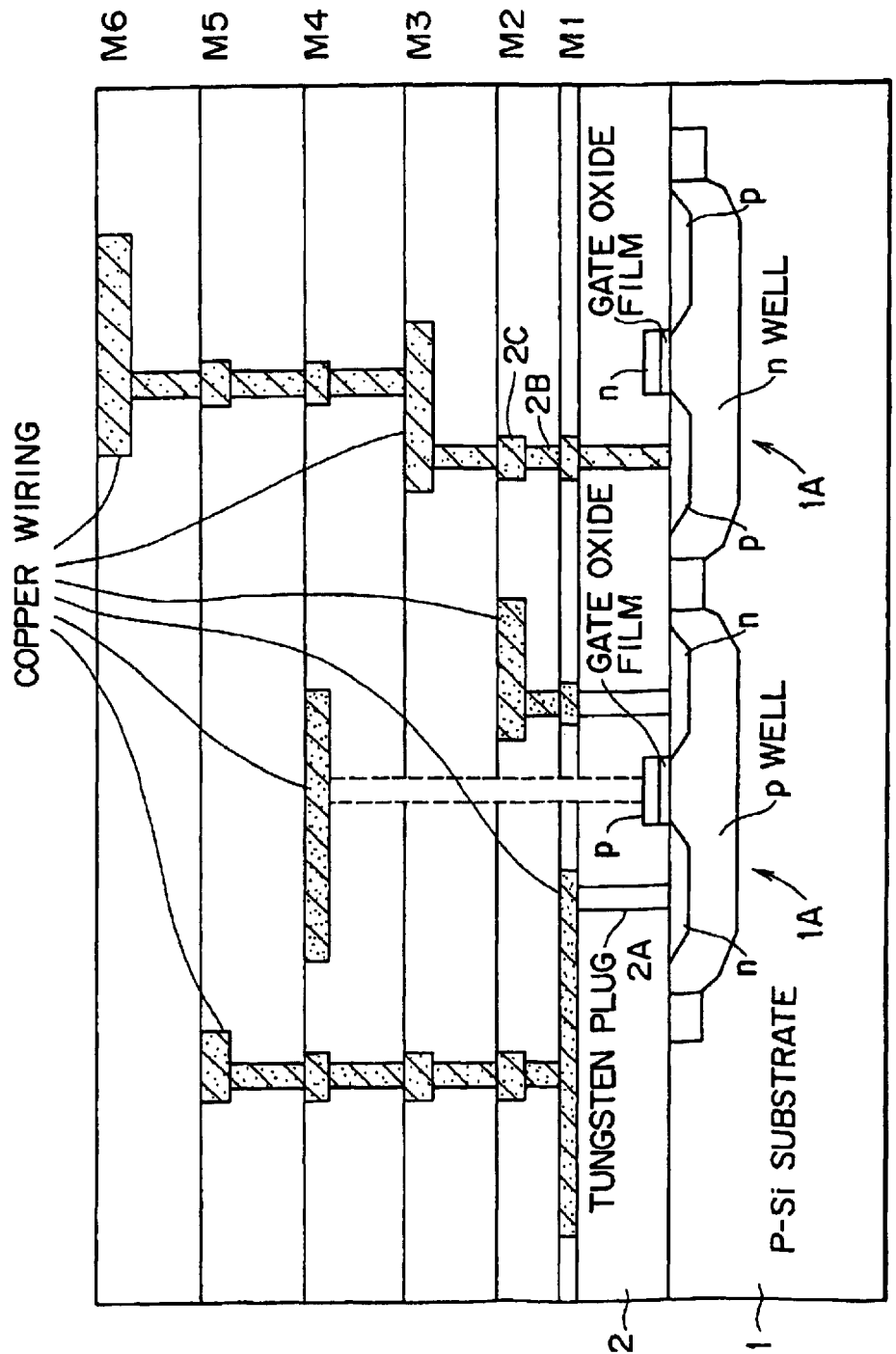
FIG. 1 is a cross section of a multi-layered ULSI structure.

FIG. 1 schematically shows a cross section of a multi-layered ULSI structure to which the present invention can be applied several times.

In FIG. 1, an insulation film 2 is formed on an Si substrate 1 formed with n·p well·n and p·n well·p transistors 1A. A first layer of metal wiring M1 is formed on the insulation film 2 by way of a reaction preventive barrier film. Holes 2A referred to as contact holes are formed in the insulation film 2 for connection with the wiring structure in the upper layer. For the lowermost layer M1, a structure of filling the portion of the hole 2A with tungsten by a CVD process is adopted so that the transistor part 1A does not react with the metal material of the wiring film and deteriorate in switching characteristics. Tungsten is used because it is extremely chemically stable and not reactive with Si or the like at the temperature of 500° C. or lower used in usual semiconductor process. Further, in the lowermost layer, extremely fine holes each of 0.15 µm or less in a diameter are formed as described above and a CVD process is adopted since this method is suitable to filling of a fine and deep hole. Since the M1 layer has no requirement of filling a hole beneath it, the M1 layer can be formed by a film-forming method at a reduced cost for which a CVD process (sputtering process) is usually adopted.

An insulation film layer is formed also on the M1 layer and, further, a metal wiring film layer M2 is formed. At or after the second layer, holes (via holes) 2B for connection with wirings or devices in the lower layer are formed, and the holes are filled with the material for the metal wiring simultaneously in the step of forming the insulation film just above. Recently, it has been noted, with a view point of reducing the number of steps, that is, reducing the cost, to form the hole as a structure formed at the bottom of a wiring trench 2C (dual damascene structure) and fill the hole simultaneously with the wiring trench with the material for the metal wiring film. In this case, the depth only for the hole is about 2.5 to 3 times the diameter and it is often about 4 to 6 times when that of with the trench is added.

Naturally, in the insulation films at or above the second layer, a hole used solely for connection from the lower layer is also formed and such a hole has a diameter greater than that of the hole described above but the aspect ratio of the hole alone is greater than that of the hole combined with the trench.

In the fourth layer M4 to the sixth layer M6, the width of the wiring, that is, the width of the trench also increases and the aspect ratio decreases relatively. The function of the present invention will be described below specifically in relation to such a multi-layered ULSI structure.

The first function of the present invention is to promote movement by diffusion of atoms in the metal material of the metal wiring film. Usually, a metal having a FCC (Face-Centered Cubic) crystal structure formed by a physical vapor deposition (PVD) process or an electrolytic plating process, for example, Cu, Ag, Pt, Au and Rh contains a lot of lattice defects at the atomic level such as dislocations or stacking faults. The presence of these defects provides the film with hardness and a property of not causing (diffusive) deformation. Further, since the FCC metal is considered to absorb less hydrogen as compared with a BCC (Body-Centered Cubic) metal, such as iron. However, the present inventors have found that FCC metals containing a lot of these defects absorb hydrogen, and that the absorbed hydrogen bonds with the lattice defects to promote diffusion of metal atoms and soften the material.

While most of details for the mechanism are still unknown, mechanical properties such as strength and hardness at the micro-level change greatly by the addition of hydrogen. Accordingly, the effect of the present invention is not restricted to that obtained by copper (Cu) and silver (Ag). The phenomenon can be expected in most cases so long as the metal is a face centered cubic structure containing a lot of dislocations or stacking faults. By the promotion of diffusion of atoms, holes or trenches that cannot be filled sufficiently by the material for the metal wiring during film formation can be filled completely in combination with the heating and annealing according to the invention.

The second function of the present invention is to conduct the heat treatment described above in a gas atmosphere at a high pressure after the film formation in a hydrogen gas containing atmosphere by the sputtering process in order to completely fill the holes or trenches, each of which is of such a small diameter that is difficult to be filled completely with the material for metal wiring film only by the first function of the invention, thereby conducting filling due to the plastic deformation (fabrication) at a high pressure and the promotion effect for the diffusion by the high pressure gas atmosphere itself.

A third function of the present invention is to conduct the heat treatment after forming the wiring film of the metal material in a gas atmosphere at a high pressure containing a gas having an oxidative effect to the metal material and a gas having a reducing effect on oxides of the metal material. The heat of reaction generated upon oxidation of the metal material and upon reduction of the oxides of the metal material can be utilized to heat the metal material and promote diffusion to fill the holes or trenches.

The fourth function of the present invention is to conduct doping or surface adsorption of hydrogen and, further, oxygen in the metal wiring film of the metal wiring material, in particular, in copper or silver material wiring films formed by a sputtering process. This promotes movement by diffusion of atoms in the metal materials for the metal wiring film, that is, the apparent deformation like that the first function of the present invention.

A fifth function of the present invention is to conduct doping or surface adsorption of hydrogen and oxygen simultaneously with the heat treatment in a gas atmosphere at high pressure to shorten the time required for the fourth function.

The five functions described above are to be described on the premise of production of an ULSI 6-layered M1–M6 structure.

Figure 2:
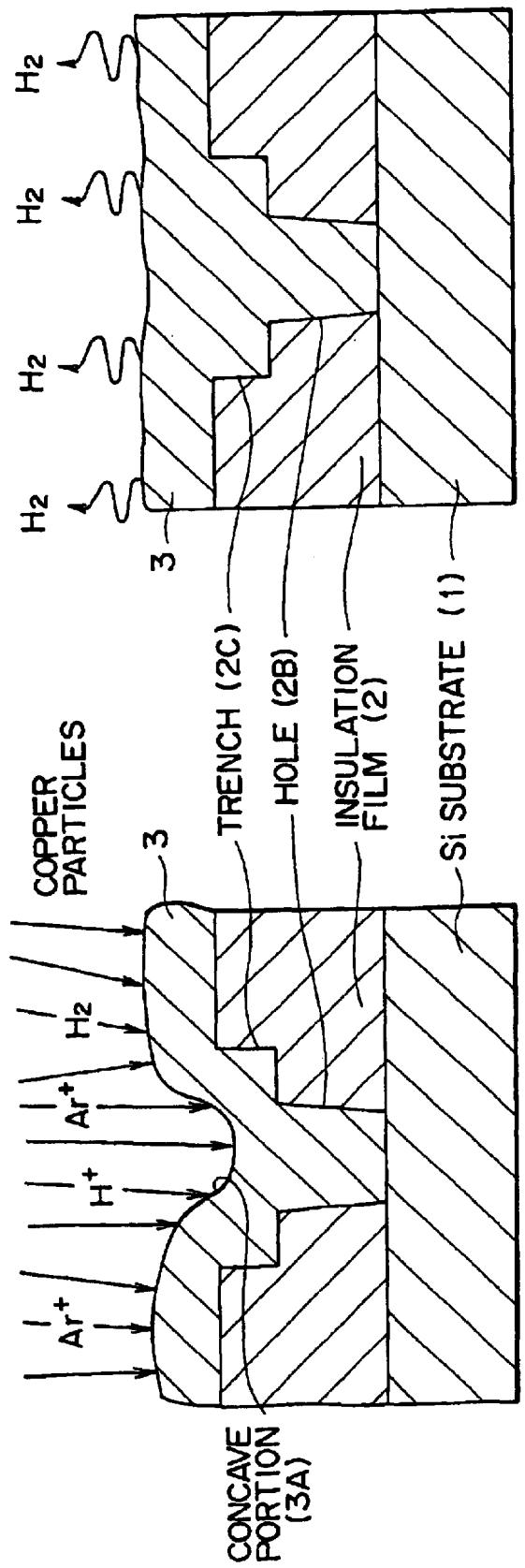
FIG. 2A schematically shows the formation of a copper wiring film by a sputtering process.
FIG. 2B shows the copper wiring film of FIG. 2A after smoothing.

The first function of the present invention is utilized in the area, for example, the fifth or sixth layer containing wirings for connecting a long distance such as between blocks in upper layers M5 and M6 of ULSI. That is, this function is applied in a case of a low aspect ratio where the hole diameter is relatively large as about 0.4 to 0.8 $\mu$m and the depth is 1 $\mu$m or less. FIGS. 2A–2B show such a process of the present invention schematically in a case of a hole and a trench in which the diameter is not so small and the depth is also not so large. FIG. 2A schematically shows the film formation of a copper wiring film 3 by a sputtering process in an inert gas (argon) atmosphere containing a hydrogen gas on the surface of a Si substrate 1 of a so-called dual damascene structure in which a hole 2B is formed at the bottom of a trench 2C in an insulation film 2. The distance between a sputtering target (not shown) and the Si substrate is selected depending on the aspect ratio and, if the aspect ratio is 2 or less, about 50 mm distance may suffice. If the aspect ratio is 2 to 4 (third layer M3, fourth layer M4 in FIG. 1), the material for metal wiring film can be deposited on the deep bottom of the hole by applying a so-called long throw sputtering process for 100 to 300 mm. In any case, a concave portion 3A as shown in the drawing often remains in the metal wiring film 3 at a central portion of the hole.

When the surface of the substrate including such a concave portion is smoothed as much as possible as shown in FIG. 2B, the amount of polishing can be decreased in the next step CMP process (Chemical Mechanical Polishing is an overall flattening method for eliminating the unevenness on the surface of the wafer by polishing the semiconductor wafer while flowing a polishing agent onto a polishing cloth on a stationary disk), which can simplify the CMP process itself and also shorten the step time. As the smoothing method, a reflow method of heating the entire substrate and utilizing the surface diffusion of the material for metal wiring film is known. Generally, diffusion of the metal material becomes remarkable when it is heated to a temperature higher than the recrystallization temperature and the recrystallization temperature is about at such a temperature, that is, "melting point of the material (absolute temperature)×0.4+300K", which is a considerably high temperature of 842K (542° C.) in a case of copper having a melting point of 1083° C.

Figure 3:
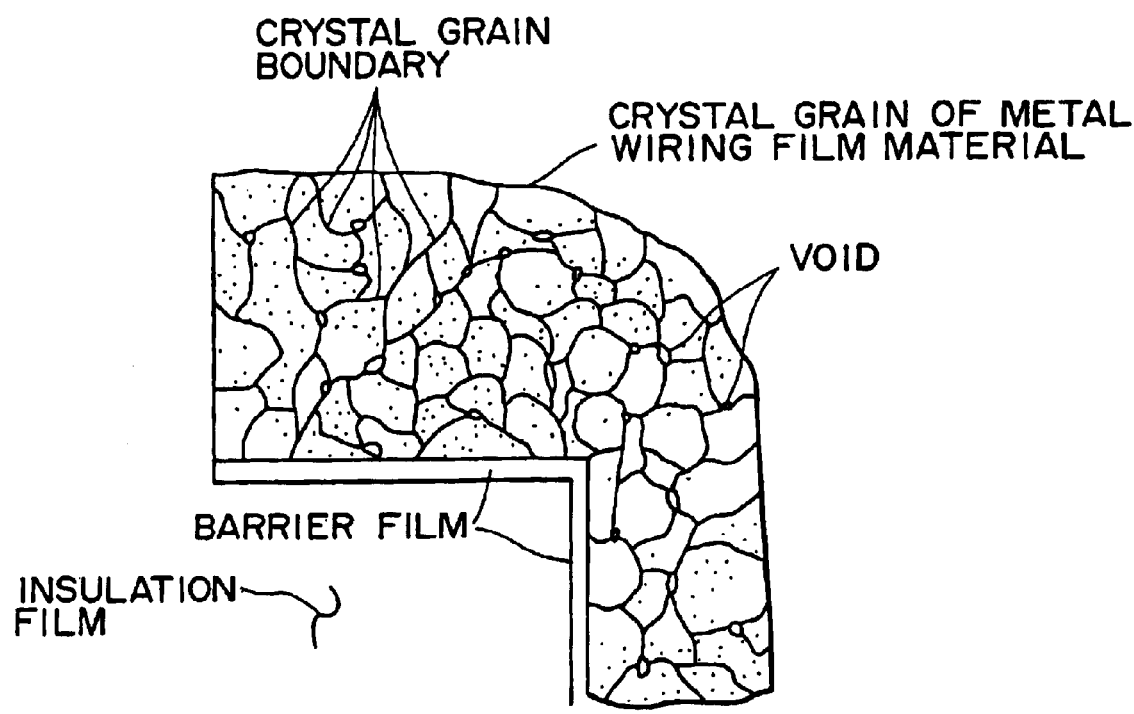
FIG. 3 is a schematic view of a copper film in which hydrogen gas can be taken up in voids between each of the particles.
Figure 4A:
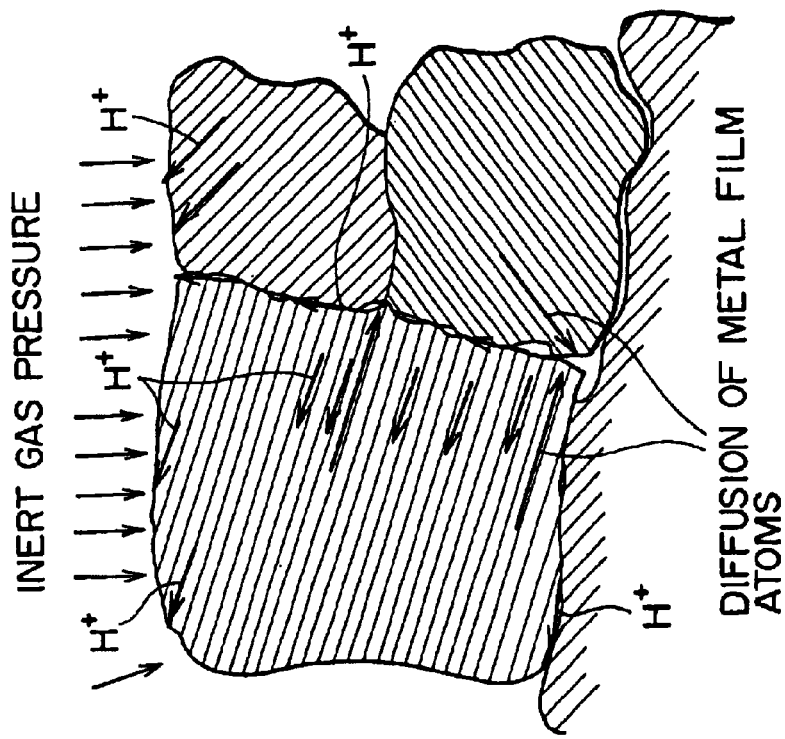
FIG. 4A is an enlarged view of FIG. 3.
Figure 4B:
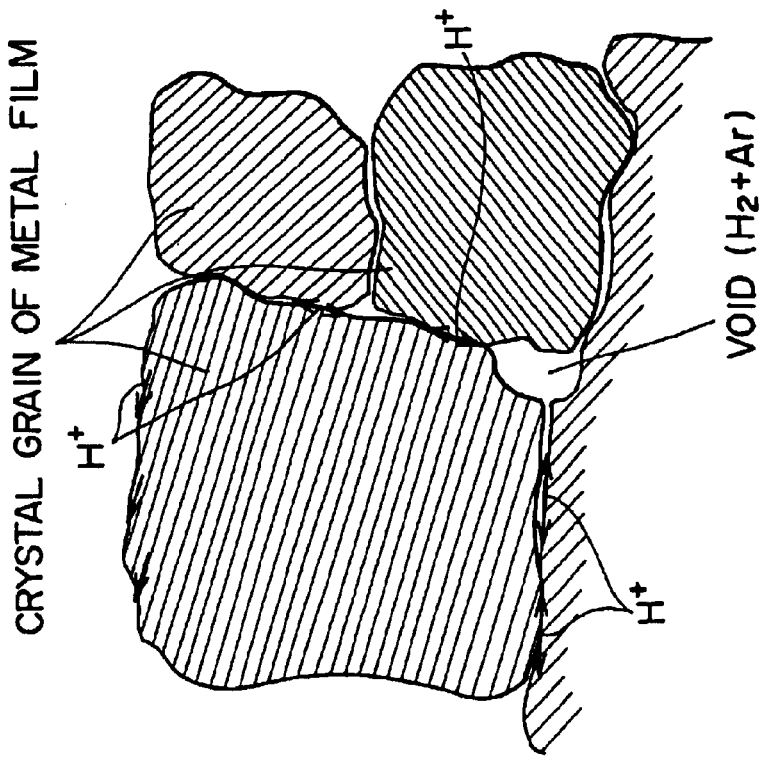
FIG. 4B is a view of FIG. 4A showing the diffusion of atoms during a pressurizing treatment.

However, when sputtering is conducted in the inert gas atmosphere containing the hydrogen gas as in the present invention, the hydrogen gas is taken into voids in the metal wiring film formed inevitably upon film formation by the sputtering process as shown in FIG. 3, to promote diffusion of copper atoms. Specifically, hydrogen atoms solid solubilized in the crystal grains of a metal wiring film as well as a hydrogen gas is taken into a void as shown in FIG. 4A upon heating treatment (reflow treatment) after the film formation by the sputtering process cause interaction with the atoms in the metal wiring film at the crystal grain boundaries and the crystal grain surface (mainly (111) face) to provide the effect of promoting movement by diffusion of the atoms in the metal wiring film and, as a result, the reflow treatment can be conducted at a temperature of 400° C. or lower.

For attaining such an effect, the hydrogen gas added to the argon gas upon film formation by the sputtering process is at defined to such an amount as providing mixing ratio by volume of the hydrogen gas to the argon gas of 1/99 to 20/80. If the amount of the hydrogen gas is insufficient, the effect of doping the hydrogen gas into the metal wiring film is not enough and, on the other hand, if the amount is excessive, it is difficult or becomes extremely instable to excite the argon gas and generate plasmas upon film formation by the sputtering process.

The reflow phenomenon is remarkable as the crystal grain size of the metal wiring film is smaller and it is extremely important to form a film comprising fine crystal grains, preferably, fine crystal grains with the grain size of 0.1 sum or less upon sputtering.

Specifically, it is recommended to set the substrate temperature within a range from room temperature–200° C. such that the temperature of the Si substrate is not so increased during sputtering. It is of course possible to compulsorily cool the Si substrate to several tens degrees C. below zero.

FIGS. 5A–5B schematically show the process of forming the wiring film according to the present invention in a case having a hole of a relatively small diameter and a rather large depth, that is, having a small diameter and with a medium degree of aspect ratio (3–4). In an ULSI multi-layered so as to have 6 to 7 layers, holes or trenches having diameter or width of such extent are contained in the second or third layer from the bottom. In this figure, a barrier layer for preventing reaction between the metal wiring film and the insulation film usually provided (refer to FIG. 3) is not illustrated.

As the aspect ratio increases, the metal wiring film can not be filled sufficiently to the deepest bottom of a hole even if a long throw sputtering process is used to often generate a void (as shown in FIG. 5A). Such a void can not be buried completely by the usual reflow process or the sputtering process near the atmospheric pressure by merely utilizing the function of promoting the diffusion due to hydrogen as the first function of the present invention described above. Therefore, it is recommended to conduct the reflow treatment in the gas atmosphere mainly comprising an inert gas at high temperature and high pressure. FIG. 5B schematically shows the function. Since the apparent deformation resistance of the material for metal wiring film is decreased and the crystal grain itself tends to cause plastic deformation by the diffusion promoting function of the atoms in the metal wiring film by hydrogen contained in the metal wiring film, the material for metal wiring film is forced to the deepest bottom of the trench or the hole by the high gas pressure and, at the same time, a fine void formed at the crystal grain boundary is also eliminated.

In a case of copper wiring film in which a hole of 0.25 $\mu$m in diameter and about 2 $\mu$m in depth is formed for instance, it is usually required a temperature of 475° C. or higher and a pressure of 300 MPa or higher in the case of using the usual sputtering process, whereas a temperature of about 350° C. and a pressure of about 100 MPa may suffice for complete filling according to the present invention.

Further, the reflow treatment has been described as being conducted in the gas atmosphere mainly comprising an inert gas at high temperature and high pressure in the foregoing explanation. When the gas is replaced partially or entirely with an oxidative gas, oxidation of the material for metal wiring film proceeds during the treatment to form oxides of the material for metal wiring film, and such oxide film of the material for metal wiring film is reduced again to the original material for wiring film by further addition of the reducing gas. In this case, when using oxygen as the oxidative gas, hydrogen as the reducing gas and copper also as the material metal wiring film, for instance, the reaction scheme is as shown below.

$Cu+½O_2=CuO$—37.9 Kcal/mol $CuO+H_2=Cu+H_2O$—20.8 Kcal/mol $H_2+½O_2=H_2O$—58.7 Kcal/mol As can be seen from the reaction scheme, since each of the reactions is an exothermic reaction, the temperature of the wiring film is locally elevated by the heat of reaction to higher than the temperature of the surrounding gas. As a result, fillage comparable with that of treating by a higher temperature can be obtained. This is the third function of the present invention.

In addition, this also provides an advantageous effect that the local temperature elevation is particularly remarkable in the metal wiring itself concerned with the reaction but there is no substantial effect of heat on the interlayer insulation film present at the periphery of the wiring film.

While oxygen is preferred for the oxidative gas, ozone ($O_3$), nitrogen sub-oxide ($N_2O$) or the like may also be used. Further, while hydrogen is preferred as the reducing gas, there is no particular restriction for the reducing gas so long as it can reduce the oxides of the metal wiring material. Further, a higher pressure is preferred for the entire gas atmosphere as far as the filling function is concerned but the scale of the apparatus increases to causes a problem with an economical point of view.

Since a pressure of 30 MPa or higher is required for developing the function described above, this is the lower limit for the pressure. While there is no particular restriction for the upper limit, a pressure of about 200 MPa, preferably, 120 MPa will be recommended with the economical point of view described above. Further, in the case of copper a preferred temperature for such pressure is about 350° C. to 380° C.

The fourth function of the present invention is applied mainly to a case of an aspect ratio of 2 to 4 (for example, in the third and fourth layers). After the film formation by sputtering, when a heat treatment is conducted in an atmosphere containing hydrogen and oxygen (redox atmosphere) at 250 to 400° C., hydrogen and oxygen are doped in the wiring film and, as a result, it is possible to modify the wiring film to an extremely soft film, that is, to a film capable of causing reflow at a low temperature with a slight force.

Further, void remain after sputtering also in a case where the aspect ratio is 3 to 6 in the second to third film layer, and the voids can be filled by plastic deformation or diffusion of the material for metal wiring film by using the pressure of the inert gas at high pressure. However, the wiring film as formed by the sputtering involves a problem that it is not soft enough to actually attain the filling and it is important to lower the temperature and the pressure upon filling with the view point of combination with the organic insulation film of low dielectric constant described above. The temperature and the pressure can be lowered by doping hydrogen and oxygen in the present invention.

Voids are present in the metal wiring film formed by sputtering as shown in FIG. 3 described above and a lot of crystal grain boundaries are formed since the crystal grain size is small when the sputtering is conducted at a low temperature. After the sputtering (sputtering in this case is not restricted to that in the inert gas atmosphere containing hydrogen described above), when the film is exposed to a mixed gas atmosphere of hydrogen and oxygen (redox atmosphere) or a steam atmosphere at high temperature, hydrogen and, further, oxygen diffuse and intrude to the crystal grain boundaries. Particularly, hydrogen dissolves in solids by intrusion in the form of atoms also into crystal lattices or lattice defects of the crystal grains. As a result, diffusion of copper atoms at the crystal grain boundaries and the inside of the crystals occurs when heating is applied above a certain temperature and internal stress or external force is exerted. As a result, it is possible to conduct the reflow treatment or filling treatment in the inert gas atmosphere at high pressure described above at a temperature of 400° C. or lower.

It has been found by the investigation of the present inventors that the amount of hydrogen and oxygen to be doped into the metal wiring film in order to attain such an effect may be at about 0.01 atom % of hydrogen as the equilibrated solid solution concentration in copper at 300 to 400° C.

The difference of surface energy that promotes change into a structure of a smaller surface area acts as the driving force smoothing the trench covering wiring film by softening of the copper or silver wiring film with the addition of hydrogen. While smoothing proceeds merely by heating at 300 to 400° C. under an atmospheric pressure after the addition of hydrogen, smoothing at a lower temperature or within a shorter period of time is possible in a high pressure inert gas atmosphere since the surface diffusion of atoms is promoted. Further, referring to the hole, it is necessary to fill the hole remaining inside of the metal wiring film itself or below the film by plastic deformation or movement of atoms in the wiring film due to diffusion. The high gas pressure itself acts as the driving force in a case of plastic deformation, and the promotion effect of the self diffusion of the atoms in the wiring film due to increase of the atom hole density at a high pressure acts as the driving force for the diffusion.

The entire steps can be shortened and the facility can be simplified by unifying the steps, by conducting doping of hydrogen/oxygen, smoothing and filling simultaneously, namely, by conducting the annealing treatment in a high pressure inert gas atmosphere containing a gas mixture of hydrogen and oxygen (redox gas) or steams, thereby forming the metal wiring film so as not to form voids at the inside and below the metal wiring film.

The hydrogen/oxygen doping is also remarkable as the crystal grain size in the metal wiring film is smaller. It is preferred to form a film comprising fine crystal grains upon sputtering since more hydrogen/oxygen can be doped. Specifically, it is recommended that the temperature upon sputtering is from room temperature to 200° C. such that the temperature of Si substrate is not elevated so high, and the Si substrate can of course be cooled compulsorily to several degrees below zero.

Further, since excessive hydrogen scatters out of the system in the annealing process under a high pressure inert gas atmosphere and doped hydrogen/oxygen are also driven out of the system during the crystal grain growth of the metal wiring film during annealing, hydrogen and oxygen scarcely remain in the semiconductor after the completion of the treatment. An effect of filling high aspect ratio holes is also possible.

For the method of conducting the hydrogen/oxygen doping, smoothing and filling simultaneously, namely, conducting the annealing treatment in a high pressure inert gas containing a gas mixture of hydrogen and oxygen (redox gas) or steams, two methods are proposed as the practical method. In the first method, hydrogen, hydrogen and oxygen or water is added to the source of an inert gas (usually, gas reservoir) used for pressurization. In this case, while it is possible to precisely control the amount of ingredients for addition, it actually takes a long time of 1 to 2 weeks for complete mixing. In a second method, a pipeline for an inert gas and a pipeline for an additive gas are joined for mixing just before entry in the high pressure process chamber. It is experimentally possible of adopting a method of previously providing an appropriate amount of water or a hydrogen-occluding alloy to the inside of the high pressure process chamber.

For the foregoing constitutions and the functions described above, crystal grains of copper or copper alloy have been mentioned as the metal material for covering the surface of the insulation film of the substrate having such an insulation film formed with holes or trenches. It will be, however, apparent that crystal grains of silver or silver alloy may also be used for the metal material also as shown in the following examples.

EXAMPLES

The effect of the present invention was confirmed mainly for samples prepared by forming a silicon oxide ($SiO_2$) film of 1.5 $\mu$m thickness on an Si substrate and etching the $SiO_2$ film after patterning to form holes or trenches as shown in Table 1. The samples were prepared by forming a TaN film as a barrier layer onto the inner surface of the holes or trenches.

The TaN film is usually formed by using a sputtering process under a mixed atmosphere of an Ar gas and an nitrogen gas. The TaN film is formed in order to prevent Cu in the film to be formed later from diffusing into the Si substrate and the $SiO_2$ film.

Conditions for the treatment and the material for the wiring film are as shown in Table 1. Further, for a portion of the samples, film formation/reflow treatment were by existent methods separately, which were used for comparison.

TABLE 1

| | Size of hole/trench | | | | Material for wiring film | Condition for film forming sputtering | | | | Condition for reflow treatment | | |
|---|---|---|---|---|---|---|---|---|---|---|---|---|
| | Hole diameter ($\mu$m) | Trench width ($\mu$m) | Entire depth ($\mu$m) | A.R. | | L.S. (mm) | Temperature (°C.) | Film Thickness ($\mu$m) | $H_2$/Ar | Pressure (MPa) | Temperature (°C.) | Time (min) |
| Example 1 | 0.5 | none | 1 | 2 | Cu | 50 | room temperature | 0.9 | 1/99 | 0.1 | 380 | 15 |
| Example 2 | 0.25 | 0.4 | 0.7 | 2.8 | Cu | 120 | 200 | 1.5 | 5/95 | 0.1 | 380 | 15 |
| Example 3 | 0.15 | none | 1 | 6.87 | Cu | 50 | room temperature | 1.5 | 20/80 | 120 | 350 | 5 |
| Example 4 | 0.13 | none | 2.4 | 7.69 | Ag | 300 | room temperature | 1 | 10/90 | 100 | 300 | 5 |
| Comparative Example 1-A | 0.25 | none | 1 | 4 | Cu | 50 | room temperature | 0.9 | none | 0.1 | 380 | 15 |
| Comparative Example 1-B | 0.25 | none | 1 | 4 | Cu | 50 | 400 | 0.9 | 1/99 | 0.1 | 380 | 15 |
| Comparative Example 1-C | 0.25 | none | 1 | 4 | Cu | 50 | room temperature | 0.9 | 25/75 | — | — | — |
| Comparative Example 1-D | 0.25 | none | 1 | 4 | Cu | 300 | room temperature | 0.9 | none | 0.1 | 450 | 15 |
| Comparative Example 2 | 0.25 | 0.4 | 0.7 | 2.8 | Cu | 120 | 200 | 1.5 | none | 0.1 | 380 | 15 |
| Comparative Example 3 | 0.15 | none | 1 | 6.67 | Cu | 50 | room temperature | 1.5 | none | 120 | 350 | 5 |
| Comparative Example 4 | 0.13 | none | 1 | 7.69 | Ag | 300 | room temperature | 1.5 | none | 100 | 300 | 5 |

TABLE 1-continued

| | Result of Treatment | Intrinsic Volumic resistivity (μΩcm) | Remarks |
|---|---|---|---|
| Example 1 | ◎ | ~1.8 | Crystal grain size after sputtering. 0.1 μm or less. Crystal grain size after high pressure treatment; 1–3 μm Filling effect confirmed all over the entire surface of substrate. Yield 95% or higher |
| Example 2 | ◎ | ~1.8 | |
| Example 3 | ◎ | ~1.8 | |
| Example 4 | ◎ | ~1.55 | |
| Comparative Example 1-A | X | | Could not be filled |
| Comparative Example 1-B | X | | " |
| Comparative Example 1-C | X | — | Plasma not stabilized upon sputtering, poor film formation. |
| Comparative Example 1-D | X | | Polyimide resin insulation film used Insulation film damaged by thermal decomposition |
| Comparative Example 2 | X | | Polyimide resin insulation film used Insulation film damaged by thermal decomposition |
| Comparative Example 3 | X | | Could not be filled |
| Comparative Example 4 | X | | Sufficiently filled for about one-half of samples |

Based on comparisons between Example 1 and Comparative Example 1-A to Comparative Example 1-D, it was demonstrated that holes and trenches could be filled if the reflow temperature after film formation was 380° C., namely, as low as 400° C. or lower, by using a gas mixture of hydrogen and argon in the sputtering film formation according to the present invention.

Further, based on the result of the test for Example 1 and Comparative Example 2, it was shown that the metal material could be filled sufficiently both in the trenches and the holes also for the dual damascene structure having a hole formed to the bottom of a trench so long as the aspect ratio was not so large, by using an argon gas with addition of a hydrogen gas upon sputtering and adopting long throw sputtering.

In Example 3 and Comparative Example 3, it was demonstrated that the metal material could be filled also to a deep hole of 0.15 μm in diameter and 0.67 in aspect ratio by the combination of sputtering with addition of a hydrogen gas and reflow treatment in a high pressure gas atmosphere according to the present invention.

In Example 4 and Comparative Example 4, it was demonstrated that a deep hole of 0.13 μm in diameter and 7.7 in aspect ratio could be filled with silver as the material for metal wiring film even at a low temperature of 300° C. at the highest throughout the sputtering and high pressure reflow steps.

Then, other examples of the present invention are shown in Table 2. Those shown in Table 2 are samples prepared by forming a wiring film with the metal material described above by the sputtering process, applying the heat treatment in a mixed gas atmosphere of hydrogen and oxygen or a steam atmosphere and then applying the annealing treatment in a high pressure inert gas atmosphere, or those prepared by forming a wiring film with the metal material described above by the sputtering process, and then applying the annealing treatment in a high pressure inert gas atmosphere containing a mixed gas atmosphere of hydrogen and oxygen or steams. The samples were prepared in the same manner as those in Table 1 in that the silicon oxide (SiO) film of 1.5 μm thickness was formed on the Si substrate, etching was applied to the S10, film after patterning to form holes or trenches and the TaN film was formed as the barrier layer for the inner surface of the holes or the trenches.

TABLE 2

| | Size of hole/trench | | | | | Condition for film forming sputtering | | | Condition |
|---|---|---|---|---|---|---|---|---|---|
| | Hole diameter (μm) | Trench width (μm) | Entire depth (μm) | A.R. | Material for wiring film | Temperature (° C.) | Film thickness (μm) | | for heat treatment H$_2$/O$_2$/Ar |
| Example 1' | 0.25 | 0.4 | 0.7 | 2.8 | Cu | 200 | 1.5 | | 0.2/0.1/99.7 (Redox) |
| Example 2' | 0.15 | none | 1 | 6.7 | Cu | room temper- | 1.5 | | none |

TABLE 2-continued

| | | | | | | ature | | | |
|---|---|---|---|---|---|---|---|---|---|
| Example 3' | 0.13 | none | 1 | 7.7 | Ag | room temperature | 1 | | none |
| Comparative Example 1' | 0.25 | 0.4 | 0.7 | 2.8 | Cu | 200 | 1.5 | | vacuum |
| Comparative Example 2' | 0.15 | none | 1 | 6.7 | Cu | room temperature | 1.5 | | none |
| Comparative Example 3' | 0.13 | none | 1 | 7.7 | Ag | room temperature | 1.5 | | none |

| | Condition for reflow treatment | | | | Result of treatment | Intrinsic volumic resistivity ($\mu \Omega cm$) | Remarks |
|---|---|---|---|---|---|---|---|
| | $H_2/O_2/Ar$ | Pressure (MPa) | Temperature (° C.) | Time (min) | | | |
| Example 1' | 0/0/100 | 70 | 380 | 15 | ⊙ | ~1.8 | |
| Example 2' | 0.1/0/99.8 | 120 | 350 | 5 | ⊙ | ~1.8 | |
| Example 3' | 0.2/0.1/99.7 (addition by water) | 100 | 300 | 5 | ⊙ | ~1.55 | |
| Comparative Example 1' | 0/0/100 | 70 | 380 | 15 | X | | Could not measure for unsufficiently filled |
| Comparative Example 2' | 0/0/100 | 120 | 350 | 5 | X | | Could not be filled |
| Comparative Example 3' | 0/0/100 | 100 | 300 | 5 | X | — | Could not be filled |

Further, based on the result of the test for Example 1' and Comparative Example 1', it was shown that both of the trenches and holes could be filled sufficiently also for a dual damascene structure having a hole formed at the bottom of the trench, so long as the aspect ratio was not so large, by applying the heat treatment in a so-called redox atmosphere of mixing hydrogen and oxygen after sputtering and then applying the reflow treatment in a high pressure inert gas atmosphere in the same manner as the result of the confirmation comparison between Example 2 and Comparative Example 2 in Table 1. In this case, while the temperature was at 380° C., the pressure was relatively low as 70 MPa. This means that an apparatus usable for a long time is available easily with a view point of the design for the high pressure apparatus used and with a view point of the fatigue resistance, which contributes much to the industrial use.

In Example 2' and Comparative Example 2', a method of the present invention of adding hydrogen upon annealing (reflow) by the high pressure inert gas and an existent annealing using the high pressure inert gas were compared for a deep hole of 0.15 $\mu$m in diameter and 6.7 in aspect ratio. When the annealing treatment was conducted at identical temperature and pressure, filling to such a deep hole was possible in Example 2' using mixing of hydrogen, whereas the high pressure annealing treatment in an inert atmosphere could not substantially fill the hole of the metal wiring film.

Example 3' and Comparative Example 4' show the result of the experiment conducted for a deep hole of 0.13 $\mu$m in diameter and 7.7 in aspect ratio in a case where silver was used as the material for metal wiring.

In Example 3', water (steam in actual treatment) was added to form an atmosphere similar with the redox atmosphere. In Comparative Example 3', a usual inert gas was used under the identical temperature and pressure. Based on the comparison between them, it was demonstrated that addition of water upon high pressure annealing according to the present invention also caused the softening phenomenon for the silver as the material for metal wiring film and it could be filled to a fine hole with a large aspect ratio even under the condition at 380° C. and 100 MPa.

The annealing treatment is applied in a high pressure inert gas after forming the wiring film with the metal material and then applying the heat treatment in a mixed gas atmosphere of hydrogen and oxygen or in a steam atmosphere, or the annealing treatment is applied in a high pressure inert gas atmosphere containing a mixed gas atmosphere of hydrogen and oxygen or steams after forming the wiring film with the metal material. However, any of the annealing treatments may be conducted, in the actual process for forming the wiring film, only on the products for which defects such as caused by conduction failure are detected by an operation test conducted in view of improvement for the efficiency or the improvement for the reliability.

Figure 6:
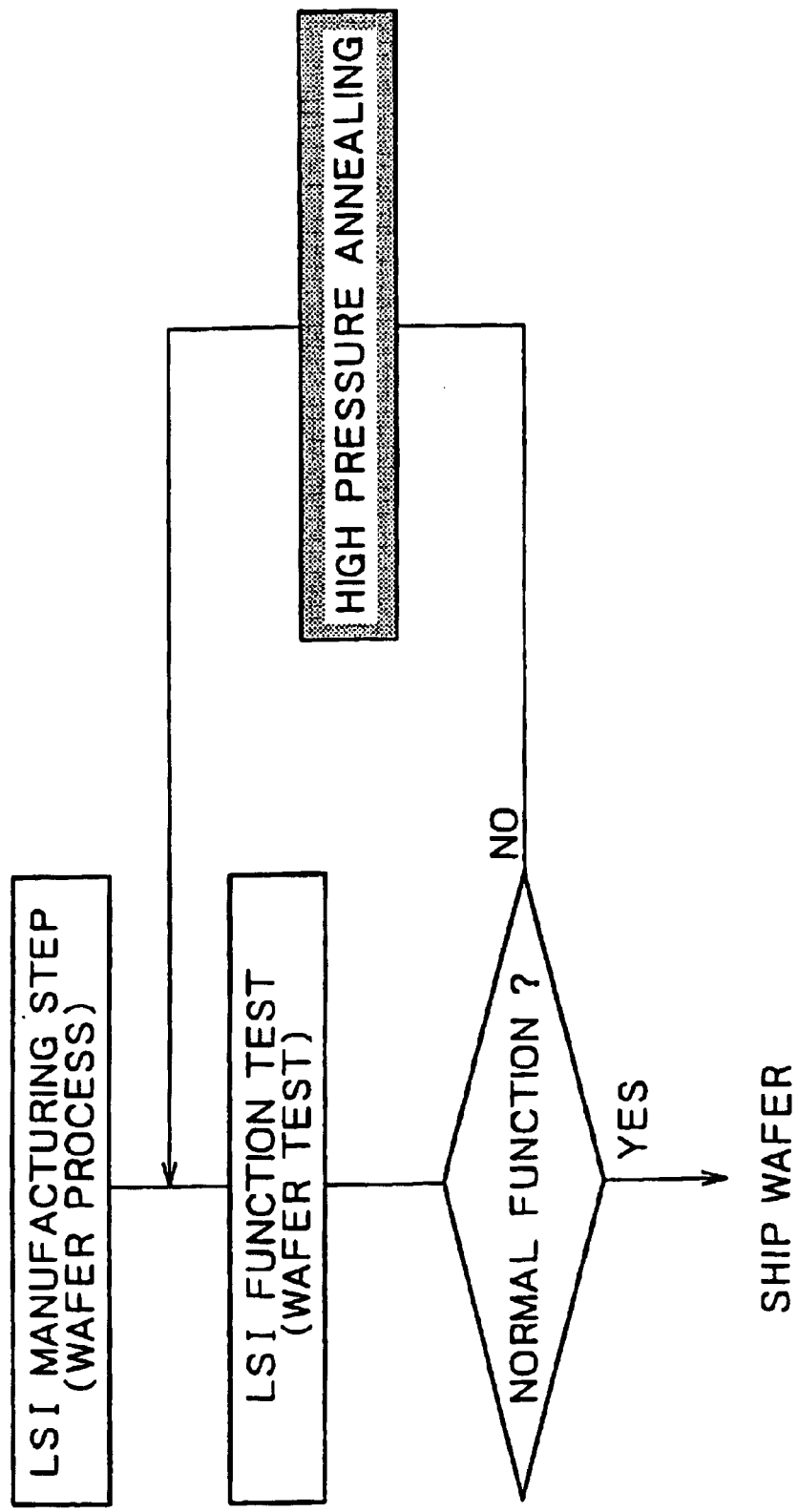
FIG. 6 is a simplified step flow chart for an LSI production process including the method of forming a wiring film according to the present invention.

FIG. 6 is a simple flow chart for steps in a case where the method of forming a wiring film as an object is applied to a so-called LSI production process. The function test used in the step, may include, for example, a test for detecting defects such as "consumption current upon operation is remarkably lower than the rated value", "no response obtainable to a specified input signal", and "no output voltage formed at all for a specified output signal", although depending on the specification for the circuit design.

As has been described above, the present invention enables the filling of holes and trenches in ULSI structures with low resistance copper and silver metallic materials that are expected to be the materials of choice for wiring films in the future. The invention was accomplished with a view point of lowering the electric resistance of the metallic material using a temperature of 400° C. or lower. This is considered essential if organic insulation film materials of low dielectric constant, which are not always highly heat resistant, are to be used. Thus the invention contributes much to the industrial production of ULSI circuits using wiring films such as copper and silver. Particularly, it can be expected that the effect of the present invention of enabling the complete filling of a fine hole of diameter of 0.1 $\mu$m or less will greatly contribute to the reduction in ULSI dimensions in the future.

The disclosures of the priority documents, Japanese Application No. 0011-183875, filed Jun. 29, 1999, and Japanese Application No. 0011-111129, filed Apr. 19, 1999, are incorporated by reference herein in their entireties.

What is claimed is:

1. A method of forming a wiring film, the method comprising:

depositing, in an atmosphere containing $H_2$ gas, a layer of a metallic material on an insulating film located on a substrate, where the insulating film contains at least one hole; and applying heat and hydrostatic gas pressure to the metallic material to fill the at least one hole with the metallic material, wherein the heat is applied so that the metallic material is at a temperature of 400° C. or lower, and the hydrostatic gas pressure is applied in a range of from 30 to 200 MPa.

2. The method according to claim 1, wherein the metallic material comprises at least one selected from the group consisting of copper, a copper alloy, silver and a silver alloy.

3. The method according to claim 1, wherein the depositing comprises sputtering, and the atmosphere containing $H_2$ gas also contains an inert gas.

4. The method according to claim 3, wherein a mixing ratio of the $H_2$ gas to the inert gas is from 1/99 to 20/80.

5. The method according to claim 3, wherein a distance between the substrate and a sputtering target is from 100 to 300 nm.

6. The method according to claim 3, wherein a temperature of the substrate during the sputtering is from room temperature to 200° C.

7. The method according to claim 3, wherein the inert gas forms more than 50% of the atmosphere containing $H_2$ gas.

8. The method according to claim 1, wherein the atmosphere containing $H_2$ gas comprises a gas that can oxidize the metallic material and a gas that can reduce oxides of the metallic material.

9. The method according to claim 1, wherein the heat is applied so that the metallic material is at a temperature of 300° C. to 350° C.

10. A method of forming a wiring film, the method comprising:

depositing a layer of a metallic material on an insulating film located on a substrate, where the insulating film contains at least one hole;

annealing the metallic material in an atmosphere comprising $H_2$ gas and at least one selected from the group consisting of oxygen and water; and applying heat and hydrostatic gas pressure to the metallic material to fill the at least one hole with the metallic material, wherein the heat is applied so that the metallic material is at a temperature of 400° C. or lower; and the hydrostatic gas pressure is applied in a range of from 30 to 200 MPa.

11. The method according to claim 10, wherein the heat is applied so that the metallic material is at a temperature of 300° C. to 350° C.

12. A method of forming a wiring film, the method comprising:

depositing a layer of a metallic material on an insulating film located on a substrate, where the insulating film contains at least one hole; and applying heat and hydrostatic gas pressure to the metallic material in an atmosphere comprising $H_2$ gas and at least one of oxygen and water to fill the at least one hole with the metallic material, wherein the heat is applied so that the metallic material is at a temperature of 400° C. or lower; and the hydrostatic gas pressure is applied in a range of from 30 to 200 MPa.

13. The method according to claim 12, wherein the heat is applied so that the metallic material is at a temperature of 300° C. to 350° C.

14. A method of forming a wiring film, the method comprising:

depositing a layer of a metallic material on an insulating film located on a substrate, where the insulating film contains at least one hole;

annealing the metallic material in an atmosphere comprising a gaseous means for oxidizing the metallic material and a gaseous means for reducing oxides of the metallic material; and applying heat and hydrostatic gas pressure to the metallic material to fill the at least one hole with the metallic material, wherein the heat is applied so that the metallic material is at a temperature of 400° C. or lower; and the hydrostatic gas pressure is applied in a range of from 30 to 200 MPa.

15. A method of forming a wiring film, the method comprising:

depositing a layer of a metallic material on an insulating film located on a substrate, where the insulating film contains at least one hole; and applying heat and hydrostatic gas pressure to the metallic material, to fill the at least one hole with the metallic material, in an atmosphere comprising a gaseous means for oxidizing the metallic material and a gaseous means for reducing oxides of the metallic material, wherein the heat is applied so that the metallic material is at a temperature of 400° C. or lower; and the hydrostatic gas pressure is applied in a range of from 30 to 200 MPa.

* * * * *

UNITED STATES PATENT AND TRADEMARK OFFICE
CERTIFICATE OF CORRECTION

PATENT NO. : 6,790,774 B2
DATED : September 14, 2004
INVENTOR(S) : Fujikawa et al.

It is certified that error appears in the above-identified patent and that said Letters Patent is hereby corrected as shown below:

<u>Title page,</u>
Item [45], should read:
-- [45] Date of Patent: Sep. 14, 2004 --.
Item [73], Assignee, should read:
-- [73]   **Kabushiki Kaisha Kobe Seiko Sho
          (Kobe Steel, Ltd.)**, Kobe (JP) --.
Item [*] Notice, should read:
-- [*] Notice:   Subjcet to any disclaimer, the term of this
                 patent is extended or adjusted under 35
                 U.S.C. 154(b) by 0 days --.

Signed and Sealed this

Sixth Day of September, 2005

JON W. DUDAS
*Director of the United States Patent and Trademark Office*

UNITED STATES PATENT AND TRADEMARK OFFICE
CERTIFICATE OF CORRECTION

PATENT NO. : 6,790,774 B2  
APPLICATION NO. : 10/314990  
DATED : September 14, 2004  
INVENTOR(S) : Fujikawa et al.

Page 1 of 1

It is certified that error appears in the above-identified patent and that said Letters Patent is hereby corrected as shown below:

<u>Title page,</u>
Item [45], should read:
-- [45] Date of Patent: Sep. 14, 2004 --.
Item [73], Assignee, should read:
-- [73] Kabushiki Kaisha Kobe Seiko Sho (Kobe Steel, Ltd.), Kobe (JP) --.
Item [*] Notice, should read:
-- [*] Notice: Subject to any disclaimer, the term of this patent is extended or adjusted under 35 U.S.C. 154(b) by 0 days --.

This certificate supersedes the Certificate of Correction issued September 6, 2005.

Signed and Sealed this

Seventh Day of April, 2009

JOHN DOLL  
*Acting Director of the United States Patent and Trademark Office*